United States Patent [19]
Bierlein et al.

[11] 3,949,323
[45] Apr. 6, 1976

[54] CRYSTALS OF (K, Rb, Tl, NH$_4$)TiO(P, As)O$_4$ AND THEIR USE IN ELECTROOPTIC DEVICES

[75] Inventors: John David Bierlein, Wilmington, Del.; Thurman Eugene Gier, Chadds Ford, Pa.

[73] Assignee: E. I. Du Pont de Nemours & Company, Wilmington, Del.

[22] Filed: Mar. 14, 1974

[21] Appl. No.: 451,120

[52] U.S. Cl. .............. 332/7.51; 252/62.9; 350/161
[51] Int. Cl.² ... H01S 3/00; G02B 5/23; C04B 35/00
[58] Field of Search.................. 332/7.51; 252/62.9; 350/161

[56] References Cited
UNITED STATES PATENTS

| | | | |
|---|---|---|---|
| 2,669,666 | 2/1954 | Mason et al. | 252/62.9 |
| 2,680,720 | 6/1954 | Jaffe | 252/62.9 |
| 3,747,022 | 7/1973 | Nanamatsu et al. | 332/7.51 |

OTHER PUBLICATIONS

Masse et al., Bull. Soc. Fr. Mineral Cristallogr. 1971, Vol. 94, No. 4 pp. 437–439; Chem. Abstracts Vol. 76, 104929, 1972.

*Primary Examiner*—Maynard R. Wilbur
*Assistant Examiner*—S. C. Buczinski

[57] ABSTRACT

Crystals of compounds of the type (K, Rb, Tl, NH$_4$)TiO(P, As)O$_4$ with the proviso that when NH$_4$ is present, As is absent, can be grown by hydrothermal methods. The crystals are optically biaxially positive, and piezoelectric and are useful in parametric amplifiers, oscillators, second harmonic generators, modulators and the like.

4 Claims, 2 Drawing Figures

CRYSTALS OF (K, Rb, Tl, NH$_4$)TiO(P,As)O$_4$ AND THEIR USE IN ELECTROOPTIC DEVICES

BACKGROUND OF THE INVENTION

1. Field of the Invention

This invention relates to single crystals of the type AtiOXO$_4$ wherein A is K, Rb, Tl or NH$_4$ and X is P or As and to their use in electrooptic devices.

2. Background of the invention

Electrooptic devices utilizing the non-zero components of the second order polarizability tensor to achieve second harmonic generation, parametric amplification, the addition and subtraction of frequencies, tunable frequencies, modulation and the like of coherent electromagnetic radiation have been described by Albert A. Ballman, Gary D. Boyd and Robert C. Miller in U.S. Pat. No. 3,262,058, by J. A. Giordmaine and Robert C. Miller in U.S. Pat. No. 3,328,723, and by Satoshi Nanamatsu and Masakazu Kimura in U.S. Pat. No. 3,747,022.

Briefly, electromagnetic waves propagating in a crystal having nonlinear optical properties induce polarization waves with frequencies which are the sum and the difference of the frequencies of the exciting waves. These polarization waves can radiate electromagnetic waves having the frequencies of the polarization waves. The energy transferred to a radiated electromagnetic wave from a polarization wave depends on the magnitude of the component of the second order polarizability tensor involved since this tensor element determines the amplitude of the polarization wave and also on the distance over which the polarization wave and the radiated electromagnetic wave can remain sufficiently in phase, called the coherence length. The coherence length is given by $\pi/(\Delta\kappa)$ wherein $\Delta\kappa$ is the difference between the wave vector of the radiated electromagnetic wave and the wave vector of the polarization wave. Phase matching occurs when the waves are completely in phase, that is when $\Delta\kappa = 0$. The condition $\Delta\kappa = 0$ can also be expressed as $n_3\omega_3 = n_1 \omega_1 \pm n_2 \omega_2$ wherein $\omega_3 = \omega_1 \pm \omega_2$ and where $\omega_1$ and $\omega_2$ are the frequencies of the incident light and $\omega_3$ is that of the radiated optical wave and the n's are the corresponding refractive indices. The plus signs are appropriate when the sum frequency is the one of interest; the minus signs are appropriate when the difference frequency is the one of interest. A particular case which will be used as a simple example of nonlinear effects is second harmonic generation (SHG) where there is only one incident wave of frequency $\omega$ and $\omega_1 = \omega_2 = \omega$ and $\omega_3 = 2\omega$.

The above phase matching conditions can be met, with birefringent crystals provided the refractive index difference between the ordinary and the extraordinary rays is sufficiently large to offset the change of refractive index with frequency, i.e., optical dispersion.

Generally phase matching is of two types:

Type I wherein the two incident waves have the same polarizations and

Type II wherein the two incident waves have orthogonal polarization.

Phase matching can be achieved by "tuning" the crystal in various ways.

1. By rotation of the crystal to vary the refractive indices.
2. By varying the temperature.
3. By application of an electric field.
4. By compositional variation.

A complication in this phase matching process is the fact that phase matching occurs only for certain crystallographic directions. If a light ray deviates from this phase-matched direction, a mismatch occurs and $\Delta\kappa$ is no longer zero. For example, when collinear phase-matched SHG is used such a situation occurs if the alignment of the incoming beam and the phase-matched crystallographic direction is not exact or if the incoming beam is slightly divergent. In general $\Delta\kappa$ will be a linear function of the deviation $\Delta\theta$ from the phase-matched direction. This places a restriction on the allowable angular divergence since a useful coherence length must be maintained. In addition, because of the double refraction, the radiated electromagnetic wave and the polarization wave will in general propagate in different directions, termed "walk-off", thereby reducing the interaction distance. Phase matching under these unfavorable conditions is called "critical phase matching" (CPM). For certain crystallographic directions, $\Delta\kappa$ does not vary linearly with the angular deviation $\Delta\theta$, but rather varies as $(\Delta\theta)^2$. As a result, greater divergence from the phase-matched direction is allowable and no first-order "walk-off" occurs. Phase matching under these conditions is called "non-critical phase matching" (NCPM). The advantages of NCPM over CPM for practical devices are obvious. The indices of refraction can be adjusted by temperature variation or compositional variation in suitable cases so that phase matching occurs for crystallographic directions along which NCPM is possible. For biaxial crystals, NCPM conditions are possible for the SHG we have been discussing only when propagation is along certain of the principal axes of the optical indicatrix. (M. V. Hobden, J. Appl. Phys. 38, 4365 [1967])

The possibility of achieving one or more types of phase matching, and the appropriate orientation of the crystal to the incident wave depends on the existence of non-zero elements in the second order polarizability tensor. Depending on the point group symmetry of the crystal some elements will be identically zero, and equalities are imposed on other elements. The magnitude of the effects will depend on the magnitude of the non-zero elements.

Accordingly, there is a need in the art to provide crystals of different useful symmetry types capable of compositional variation, and preferably having non-linear electrooptic properties which are large in magnitude.

R. Masse and J. C. Grenier, Bull. Soc. Mineral Crystallogr. 94, 437–439 1971 have described the properties of MTiOPO$_4$ wherein M is K, Rb or Tl in the form of fine crystalline powder.

SUMMARY OF THE INVENTION

It has now been discovered that useful non-linear optical properties are possessed by crystals of compounds having the formula MTiOXO$_4$ wherein M is at least one of K, Rb, Tl or NH$_4$ and X is at least one of P or As, except when NH$_4$ is present then X is only P.

Crystals of these compounds having a least dimension of 1 mm can be made by hydrothermal methods.

This invention therefore encompasses such crystals and nonlinear optical devices employing the same as the nonlinear element wherein means are provided to direct at least one incident beam of electromagnetic radiation into said crystal whereby electromagnetic radiation emerging from said crystal contains at least one frequency different from any frequency of an incident beam of radiation.

This invention also encompasses optical modulators whereby an electric field is applied to a crystal of this invention to change the polarization of a beam of electromagnetic radiation passing through the same.

DRAWINGS AND DETAILED DESCRIPTION OF THE INVENTION

Figure 1:
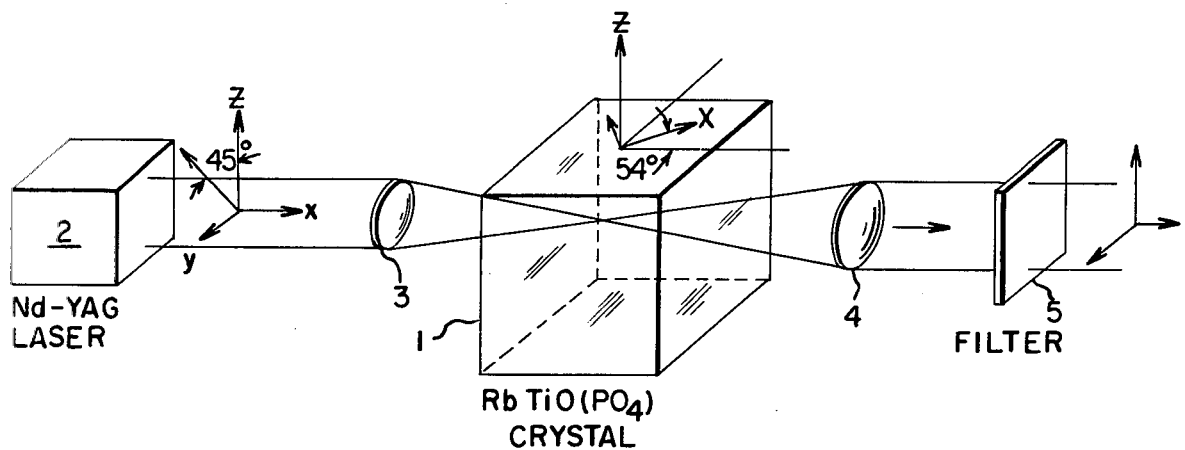
FIG. 1 illustrates a method of generating second harmonic radiation using a crystal of $RbTiO(PO_4)$.

Turning now to the drawings, in FIG. 1 a crystal of $RbTiO(PO_4)$ (1) is shown oriented so that the z direction (corresponding to the c-axis of the $Pna2_1$ space group) is oriented vertically and the x axis (corresponding to the crystallographic a axis) is oriented at 54° to the optical path through the crystal. Polarized light of wavelength $1.06\mu$ from a Nd-YAG laser 2 is incident on the crystal along the optical path, the plane of polarization being oriented at 45° from the z direction. A lens 3 having a focal length of 15 cm focuses the light into the crystal. Light emerging from the crystal is collimated by a similar lens 4 and passed through a filter 5 adapted to remove light of wavelength $1.06\mu$ while passing light of wavelength $0.53\mu$. The second harmonic of the incident light emerges with its plane of polarization perpendicular to the z direction.

The critical phase matching conditions, $$n(2\omega) = \tfrac{1}{2}[n(\omega) + n_z(\omega)]$$

wherein $$\frac{1}{n^2} = \frac{\sin^2 54°}{n_y^2} + \frac{\cos^2 54°}{n_z^2}$$

are satisfied by the above selection of conditions at ambient temperature.

For the above experimental arrangement and with light propagating along the $x =$ a direction, noncritical phase matching can be accomplished at ambient temperature for light of wavelength $1.13\mu$ when the incident light is polarized in the Y-Z plane at 45° from the Z axis; the condition being $$n_y(2\omega) = \tfrac{1}{2}[n_y(\omega) + n_z(\omega)]$$

Likewise for propagation along the y direction, noncritical phase matching is achieved with incident light of wavelength $1.03\mu$.

It will further be apparent to those skilled in the art that the crystals of the present invention are useful in other devices utilizing the nonlinear properties such as up and down conversion parametric amplifiers, oscillators and the like.

Figure 2:
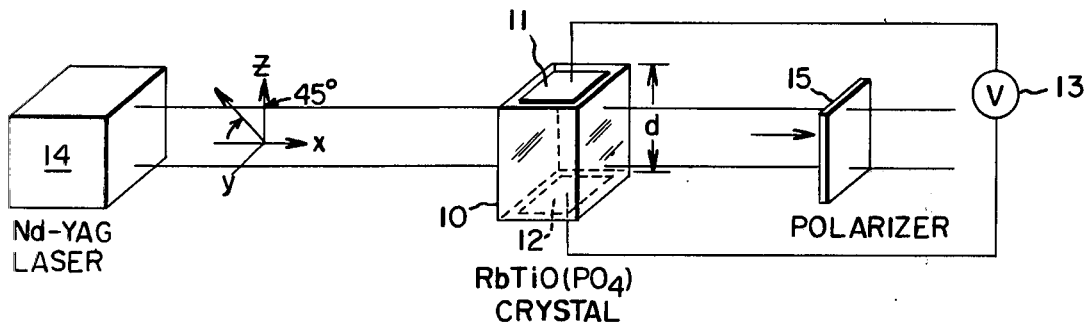
FIG. 2 illustrates a method of modulating the intensity of a beam of polarized light using a crystal of $RbTiO(PO_4)$.

The crystals are also useful as electrooptic modulators. In FIG. 2 a crystal cube 10 of $RbTiO(PO_4)$ is cut with faces perpendicular to the x, y and z axes. The cube is equipped with electrodes 11, 12 on the two opposing faces cut perpendicular to the z axis. A voltage V can be applied to electrodes 11 and 12, which are spaced by a distance $d$, from a voltage source 13. Light from a source 14 such as a Nd-YAG laser, polarized in the yz plane is incident on the crystal 10, which is oriented with its x axis along the optical path. Light emerging from the crystal after traveling a distance L in the crystal passes through a polarizer 15.

Upon passing through the crystal, the y component of the radiation is retarded with respect to the z component by an amount $\Gamma$ given by $$\Gamma = \frac{2\pi L}{\lambda}(n_z - n_y) + \frac{\pi LV}{\lambda d}(n_z^3 r_{33} - n_y^3 r_{23})$$

wherein $r_{33}$ and $r_{23}$ are the linear electrooptic coefficients.

L is selected to satisfy $$\frac{2\pi L}{\lambda}(n_z - n_y) = (2m + 1)\frac{\pi}{2}$$

where $m$ is an integer or zero. With this pathlength the output beam is polarized at 90° to the input beam at zero voltage. Polarizer 15 is set to block the exit beam. Application of a voltage changes $\Gamma$ thereby permitting radiation to pass the polarizer 15.

The crystals of the present invention have the formula

wherein M can be one or mixtures of more than one univalent metal K, Rb or Tl or ammonium $NH_4^+$ and X can be P or As, provided that if ammonium ions are present, as a whole or part of M, then X in $XO_4$ must consist only of P.

The compounds can be grown by hydrothermal methods of which two are illustrated in the specific embodiments described hereinafter. Broadly, in one method, the different ingredients, including flux, $H_2O$, and $TiO_2$ are placed in a collapsible tube which is then sealed. The sealed tube is then heated to a temperature at which all solids are in solution and then slow cooled over a period of days to a substantially lower temperature. The resultant crystals can be recovered by washing the flux away with water. In the second method, the tube is filled with a flux of $MH_2XO_4$, $H_2O$, and MOH or $H_3XO_4$ to adjust the M/X ratio. Non-dusting chips or sintered pellets of $TiO_2$ are added and retained at one end of the tube and the tube sealed. The tube is then heated in a temperature gradient with the $TiO_2$ chips at the hotter end and the other end at a substantially lower temperature where the $MTiOXO_4$ crystallizes from the flux.

Other crystalline compositions, notably $MTi_2(XO_4)_3$ (space group $R\bar{3}c$ symmetry) and $M_2Ti_6O_{13}$, can be formed from the same components in this process. The important variables which determine which species will crystallize depends, inter alia, on crystallizing temperature, concentration in the flux, M/X ratios, water/solids ratio in the flux, and the selected M and X atoms.

Generally, at any given M/X ratio and crystallization temperature, the formation of the desired $MTiO(XO_4)$ is favored by a dilute flux rather than a concentrated flux in terms of solids content.

At a given temperature and at a given flux concentration, the compounds $MTi_2(XO_4)_3$, $MTiOXO_4$, $M_2Ti_6O_{13}$ and $TiO_2$ are favored in that sequence with increasing ratio of M/X.

For $KTiOPO_4$ preferred conditions are a crystallization temperature of 500°–800°C. K/P ratio of 0.8 to 1.5 and a flux concentration of 7.0 to 1.0 gm potassium phosphate/cc $H_2O$.

For $KTiAsO_4$, the same conditions can be employed except K/As should be 0.6 to 1.0.

For $RbTiOPO_4$ the crystallizing temperature should be 400°–700°C, Rb/P should be 0.9 to 1.5 and flux concentration should be 10.0–2.0 gm rubidium phosphate/cc $H_2O$.

The crystals so grown belong to the acentric point group mm2 (space group $Pna2_1$, Z = 8) and grow as prisms with (100) and (110) faces. Additional (011) and (201) faces may also be present. In mineralogical terminology the crystals are unit prismatic with brachypinacoid (100) faces, (201) brachydomes and (110) macrodomes.

Crystals having a least dimension greater than 1 mm are readily obtained by the procedures outlined above and described in the specific embodiments hereinafter. The crystals have a transmission window for wavelengths ranging from about $0.35\mu$ to about $4.5\mu$, and are positive biaxially birefringent with a relatively large difference in the three principal refractive indices, which renders them suitable for both critical and noncritical phase matching for SHG and for other applications of nonlinear optic materials.

For $RbTiOPO_4$ the three refractive indices can be described by the single term Sellmeier relations $$n^2 - 1 = \frac{S_0\lambda_0^2}{1-(\lambda_0/\lambda)^2}$$

with

| Index | $S_0$ | $\lambda_0$ |
|---|---|---|
| $n_x$ | $88.65\mu^{-2}$ | $0.153\mu$ |
| $n_y$ | $80.26\mu^{-2}$ | $0.161\mu$ |
| $n_z$ | $74.63\mu^{-2}$ | $0.178\mu$ |

In the above, the $x$, $y$, and $z$ axes correspond to the crystallographic axes $a$, $b$, and $c$ respectively.

For SHG critical Type I phase matching can be achieved at room temperature with this material over the range of transmission. Type II critical phase matching can be achieved for wavelengths greater than $1.03\mu$ at room temperature. For electromagnetic radiation propagating along the $y$ direction and having the incident beam at 45° to the $z$ axis, a second harmonic wave polarized along the $x$ axis emerges which is noncritically phase matched for $1.03\mu$ radiation at room temperature.

For propagation along the $x$ direction and with a plane polarized beam at 45° to the $z$ direction, noncritical phase matching occurs at $1.13\mu$.

For the first case the matching condition is $$n_x(2\omega) = \tfrac{1}{2}(n_x(\omega) + n_z(\omega))$$

and for the second case $$n_y(2\omega) = \tfrac{1}{2}(n_y(\omega) + n_z(\omega))$$

Conoscopic measurements have shown that $n_z - n_x$ increases with increasing temperature while $n_y - n_x$ remains essentially constant. The temperature can be used to "tune" the above noncritical phase matching conditions to suit a particular source, e.g., a Nd-YAG laser giving a fundamental wavelength of $1.06\mu$. As noted heretofore compositional variation can also be employed to tune the nonlinear device at a given temperature.

For the mm2 point group the coefficients $d_{24}$, $d_{31}$, $d_{32}$, $d_{33}$ and $d_{15}$ of the second order polarizability tensor expressed in the conventional matrix notation with ($d_{ijk} = d_i \mu$) are non-zero. Thus for SHG $$P_x(2\omega) = 2 d_{15} E_x(\omega) E_z(\omega)$$

$$P_y(2\omega) = 2 d_{24} E_y(\omega) E_z(\omega)$$

$$P_z(2\omega) = d_{31} E_x^2(\omega) + d_{32} E_y^2(\omega) + d_{33} E_z^2(\omega)$$

wherein $E_k(\omega)$ is the electric field in the $k^{th}$ direction, $d_{ij}$ is the nonlinear optical coefficient and $P_i(2\omega)$ is the induced second harmonic polarization.

The nonlinear coefficient, $d_{24}$, $d_{33}$ and $d_{32}$ determined by the Maker fringe technique (P. D. Maker, R. W. Terhune, M. Nisenhoff and C. M. Savage, Phys. Rev. Letters 8, 21 [1962]) to be $d_{24} = 21.4 \times d_{11}^q$, $d_{33} = 38.4 \times d_{11}^q$ and $d_{32} = 14.3 \times d_{11}^q$ is the nonlinear coefficient $d_{11}$ for $\alpha$-quartz.

All of the compounds described in the examples can be shown to possess substantial nonlinear optic properties and to be phase matchable by the Kurtz powder method (S. C. Abraham, S. K. Kurtz and P. B. Jamieson, Phys. Rev. 172, 551 [1968]).

The use of crystals having nonlinear optic properties in optical devices is well known in the art, as shown by U.S. Pat. No. 3,747,022, 3,328,723 and 3,262,058. The matching conditions required for biaxially birefringent crystals such as the positive biaxial crystals of the present invention are described by M. V. Hobden, Jr. (Journal of Applied Physics 38, 4365 [1967]).

EXAMPLE 1

A gold tube 6 inches in length and having a diameter of ⅜ inch O.D. having a 10 mil wall sealed at one end was filled with 12.0 gm $KH_2PO_4$ (m. pt. 253°C) and 0.46 gm of $TiO_2$ chips were placed on top of the $KH_2PO_4$. The top end of the tube was crimped, the tube cooled in ice water, then the crimp was sealed by melting the crimped edge in an oxy-gas flame. The tube was placed horizontally in a pressure vessel inside an internal furnace having resistance windings adapted to produce a temperature gradient. The vessel was pressured to 3000 atm. with argon; then the furnace was heated to produce a temperature of 920°C at the end of the tube containing the $TiO_2$ chips and 750°C at the other end. After 65 hours, the furnace was cooled, the pressure released and the tube removed and cut in half. The material in each half was extracted with water. From the half which was at the hot end of the furnace was recovered 0.52 gm colorless microcrystals. From the cold end was obtained 0.57 gm of microcrystals and 0.22 gm of large, clear, transparent crystals up to 6 mm in size; consisting of two types. One phase was chunky crystals, strongly piezoelectric. X-ray analysis gave a Haag-Grunier pattern consistent with space group $Pna2_1$, with $\alpha = 12.8157$, b = 6.4026, c = 10.5866 (least squares refinement) and was $KTiO(PO_4)$. The second phase was flatter, more tabular, crystals which were not piezoelectric and were $KTi(PO_4)_3$ with $R\bar{3}c$ symmetry.

EXAMPLE 2

A ⅜ inch O.D. by 6 inch long gold tube was charged with 3 cc of 5.45 N RbOH, 7 cc of water, 20 gm of $RbH_2PO_4$ and 0.48 g of $TiO_2$. The tube was sealed and placed in an internally heated pressure vessel which had very little temperature gradient from end to end. A pressure of 3000 atm of argon was applied and the furnace was heated to 900°C. It was then cooled to 300°C in about 60 hours, then cooled further to room temperature in 2–3 hours. After reducing the pressure and removing the gold tube, 1.40 gm of large crystals were recovered. The biggest crystal was 9 × 5 × 3 mm but was not optically perfect. Another crystal which was clear and transparent was 7 × 4 × 3 mm in dimension. All of the crystals were isomorphous with $KTiO(PO_4)$ of $Pna2_1$ symmetry.

EXAMPLE 3

Using the procedure of Example 2 a charge of 3 cc of 4.54 N RbOH, 7 cc of $H_2O$, 10 g of $RbH_2PO_4$, 11.35 gm of $RbH_2AsO_4$ and 0.48 mm of $TiO_2$ was employed, heated to 850°C and slow-cooled to 50°C over 89 hours. Clear and transparent crystals of up to 2 mm on an edge were obtained. X-ray analysis, and use of Vegard's law indicated that the product was $RbTiO(P_{0.6}As_{0.4}O_4)$.

EXAMPLE 4

Using the procedure of Example 2, to a ⅜ inch × 6 inch gold tube was charged 3 cc of water, 9.0 gm of $KH_2AsO_4$ and 0.16 gm of $TiO_2$. The tube was heated to 850°C under 3000 atm pressure and cooled to 280°C in 71 hours, then rapidly cooled to room temperature. There was recovered 0.49 gm of crystals up to 3 mm in dimension of $KTiO(AsO_4)$.

EXAMPLE 5

Using the procedure of Example 1, a ⅝ inch × 6 inch gold tube was charged with 4 cc of water, 19.4 gm of $RbH_2AsO_4$ and 1.4 gm of $RbOH·2H_2O$ as a flux. Two pellets of $TiO_2$ weighing 0.78 gm were placed at one end, covered with 1 gm of $RbH_2AsO_4$ and the tube sealed. The tube was heated with the end containing the pellets at 750°C and the cool end at 650°C for 69 hours under 3000 atm pressure. There was recovered 2.01 gms of crystals up to 5 × 5 × 2 mm, of $RbTiO(AsO_4)$ isomorphous with $KTiO(PO_4)$ by x-ray diffraction ($a = 13.2515, b = 6.6764, c = 10.7590$).

EXAMPLE 6

Using the method of Example 1, a ⅜ inch × 6 inch gold tube was charged with a flux containing 1 cc of water, 3.80 gm of $NH_4H_2PO_4$ and 4.35 gm of $(NH_4)_2HPO_4$. 0.4 Gm of $TiO_2$ powder was added at one end. The tube was heated in a gradient of 650°C at the end containing the $TiO_2$ to 500°C at the other end for 68 hours, and then rapidly cooled. Product of $NH_4TiO(PO_4)$ in the amount of 0.73 gm was recovered. Crystals up to 1 mm size were obtained isomorphous with $KTiO(PO_4)$ ($a = 12.9116, b = 6.4869, c = 10.5950$) by x-ray diffraction.

EXAMPLE 7

Using the procedure of Example 2, a ⅜ inch × 6 inch gold tube was charged with 3.0 cc of water, 9.0 gm of $TlH_2PO_4$ and 0.16 gm of $TiO_2$, sealed, heated to 900°C under pressure and slow-cooled to 530°C in 60 hours and then to 100°C in a further 31 hours. The product weighed 0.7 gm, and consisted of large crystals, the biggest dimension being 9 mm, of $TlTiO(PO_4)$.

EXAMPLE 8

To a ⅜ inch × 6 inch gold tube was charged a flux of 19 g of $RbH_2PO_4$, 1.0 cc of $H_2O$ and 1.4 g of $RbOH·2H_2O$. At one end of the tube was placed 0.80 g of $TiO_2$ pellets covered with 1.0 g of $RbH_2PO_4$ and restrained from moving with gold gauze. The tube was sealed and heated in a temperature gradient of 750°C to 620°C for 68 hours under a pressure of 3000 atm, the $TiO_2$ pellets being at the hot end of the gradient. Crystals of $RbTiO(PO_4)$ having sizes up to 5 × 3 × 2 mm were recovered.

EXAMPLE 9

To a ⅜ inch × 6 inch gold tube was charged 7.0 g of $RbH_2PO_4$, 3 cc of $H_2O$ and 0.12 g of $TiO_2$. The tube was sealed, heated to 800°C to effect solution and reaction, slow cooled to 300°C at a rate of 7.7°C/hour, then quenched. The product was 0.37 gm of crystals of $RbTiO(PO_4)$, up to 7 mm in largest dimension. One crystal having particularly good optical properties was 4 × 2 × 1 mm in size.

We claim:

1. In a nonlinear optical device comprising means to direct at least one incident beam of electromagnetic radiation into a crystal having nonlinear optical properties whereby electromagnetic radiation emerging from said crystal contains at least one frequency different from the frequency of any incident beam of radiation, wherein the improvement comprises a crystal consisting of a compound having the formula $$MTiO(XO_4)$$

wherein M is at least one K, Rb, Tl or $NH_4$ and X is at least one of P or As and wherein X is P when M is $NH_4$ as said crystal having nonlinear optical properties.

2. Device of claim 1 wherein said crystal is $RbTiO(PO_4)$.

3. In an electrooptic modulator comprising means to direct a beam of polarized radiation into a birefringent crystal, and means to apply an electric field to said crystal to change birefringence, whereby the polarization of radiation emerging from said crystal is changed, wherein the improvement comprises said crystal consisting of a compound having the formula $$MTiO(XO_4)$$

wherein M is at least one of K, Rb, Tl or $NH_4$ and X is at least one of P or As and wherein X is P when M is $NH_4$ as said birefringent crystal.

4. Device of claim 3 wherein said crystal is $RbTiO(PO_4)$.

* * * * *